US006180876B1

(12) United States Patent
Holmes

(10) Patent No.: US 6,180,876 B1
(45) Date of Patent: Jan. 30, 2001

(54) APPARATUS AND METHOD FOR RF SHIELDING OF A PRINTED CIRCUIT BOARD

(75) Inventor: John A. Holmes, Waterloo (CA)

(73) Assignee: Research In Motion Limited, Waterloo (CA)

( * ) Notice: Under 35 U.S.C. 154(b), the term of this patent shall be extended for 0 days.

(21) Appl. No.: 08/999,354

(22) Filed: Dec. 29, 1997

(51) Int. Cl.$^7$ ...................................... H05K 9/00
(52) U.S. Cl. .................... 174/35 R; 174/35 MS; 361/818; 361/814; 361/816; 277/233; 277/234; 277/901
(58) Field of Search ................ 174/35 GC, 35 MS; 277/233, 234, 901; 361/818, 814, 816

(56) References Cited

U.S. PATENT DOCUMENTS

| 5,053,924 | 10/1991 | Kurgan .................................. 361/424 |
| 5,150,282 | 9/1992 | Tomura et al. ....................... 361/424 |
| 5,177,324 | 1/1993 | Carr et al. ........................... 174/35 R |
| 5,262,596 | 11/1993 | Kawakami et al. .................. 174/261 |
| 5,297,007 | 3/1994 | Deyo et al. .......................... 361/707 |
| 5,428,508 | 6/1995 | Pronto ................................... 361/818 |
| 5,550,713 | 8/1996 | Pressler et al. ....................... 361/818 |
| 5,565,656 | * 10/1996 | Mottahed ......................... 174/35 GC |
| 5,577,268 | * 11/1996 | Ho et al. ............................... 455/90 |
| 5,639,989 | * 6/1997 | Higgins, III .................... 174/35 MS |

FOREIGN PATENT DOCUMENTS

| 3-104196 | * 9/1989 | (JP) ................................... 174/35 R |
| 3-190197 | * 12/1989 | (JP) ................................... 174/35 R |

* cited by examiner

Primary Examiner—William A. Cuchlinski, Jr.
Assistant Examiner—Ronnie Mancho
(74) Attorney, Agent, or Firm—Jones, Day, Reavis & Pogue; Charles B. Meyer, Esq.

(57) ABSTRACT

An apparatus and method for shielding discrete areas of a printed circuit board from electromagnetic interference includes a frame and separate shielding lids. The frame is surface mount soldered onto the solder tracks of a printed circuit board and provides fences which divide the printed circuit board into discrete areas. Separate shielding lids of different heights are provided to shield the separate discrete areas. The separate shielding lids mount inside the discrete areas defined by the fences of the frame and attach to lips formed on interior surfaces of the fences.

6 Claims, 2 Drawing Sheets

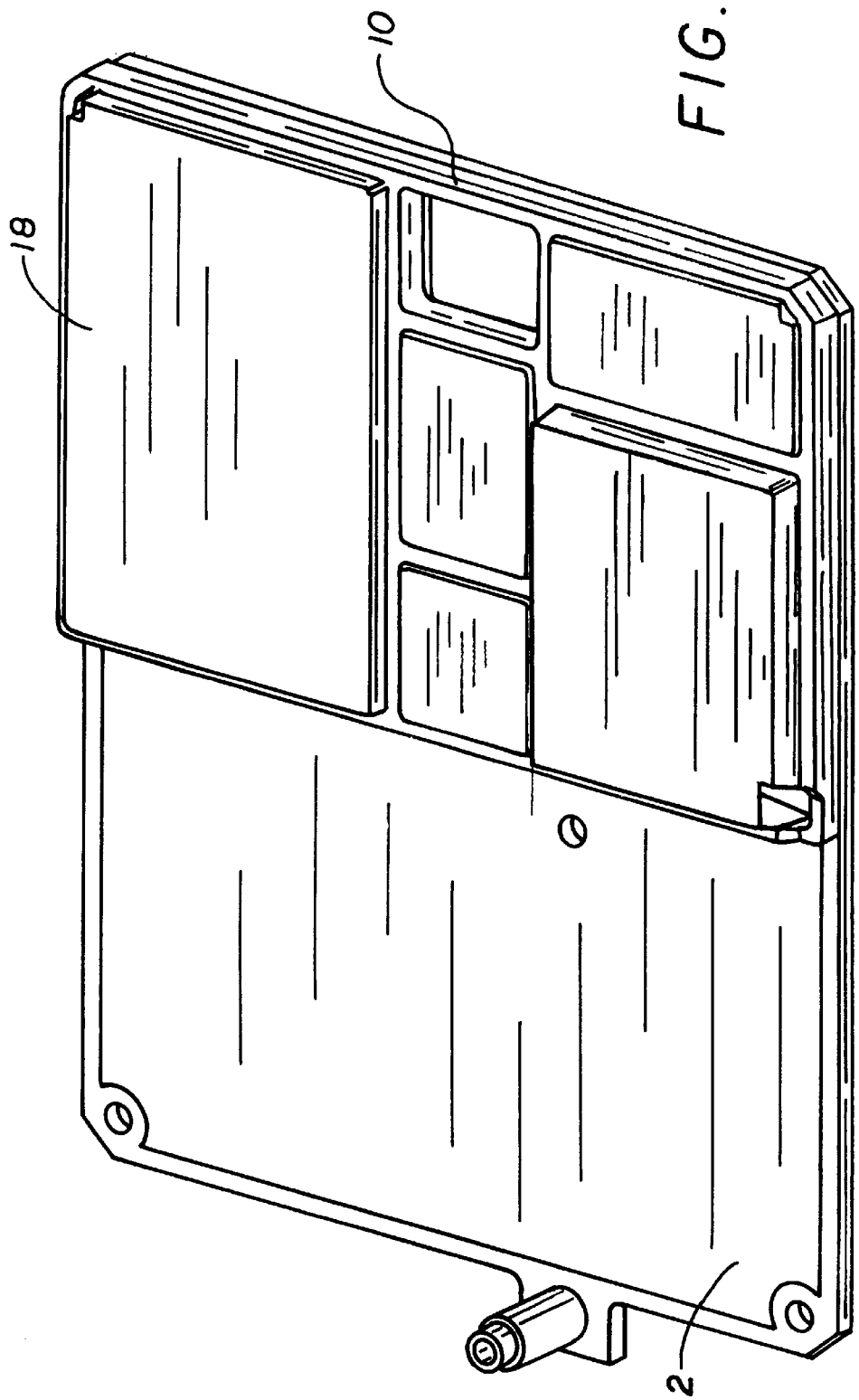

APPARATUS AND METHOD FOR RF SHIELDING OF A PRINTED CIRCUIT BOARD

BACKGROUND OF THE INVENTION

The present invention is directed toward the field of Electromagnetic Interference ("EMI") shielding, and more particularly to a system for shielding discrete areas on printed circuit boards in order to minimize the transmission of EMI from one area to another.

Many electronic devices, such as communication equipment, use electrical circuits and components that generate and/or use high-frequency time-varying voltage signals. A naturally occurring byproduct of these high frequency signals is electromagnetic ("E/M") fields. The E/M fields can interfere with and affect the functioning of adjacent electrical components which are sensitive to EMI. In addition, federal regulations exist that limit the amount of E/M energy an electronic device can emit. Therefore, it is desirable in the design of electrical devices to provide shielding to reduce the level of E/M energy that particular circuits and components emit.

In many electronic devices, electrical components are mounted on printed circuit boards ("PCBs") and connected to other components mounted on the same PCB. Components of different circuits may be mounted on the same PCB. The E/M fields created by the components of the various circuits on the PCB may interfere with components of other circuits on the same or on a nearby PCB. As a result, it is desirable to place one or more shields on a PCB to surround the components that generate substantial EMI in order to protect other components from the E/M fields.

The miniaturization of electronic devices presents additional challenges when designing circuits that do not interfere, electromagnetically, with each other. Because less space is available in laying out miniaturized circuits, EMI-generating components may be placed in close proximity to EMI-sensitive components on the same PCB. Also, electronic devices having multiple PCBs may the PCBs arranged such that the components of one PCB face the components of another PCB. This could result in EMI-sensitive components being placed in close proximity to EMI generating components from other PCBs within the same electronic device.

Present methods for providing EMI shielding on PCBs include at least four techniques. In one method, a die cast frame is soldered to the PCB. The walls of the frame divide the PCB into discrete areas which are to be shielded. A single lid is used to cover the entire frame including all of the discrete areas. A compressible conductive material is applied to the inside of the lid in order to insure that the lid maintains mechanical and electrical contact with the interior walls of the frame. The lid is fastened to the frame using dimples that snap over a ledge on the outside section of the frame wall. This method of shielding has many deficiencies. First, there is only one lid that encloses the multiple discrete areas. As a result, E/M energy can be transmitted between adjacent areas. EMI generated in one discrete area can be transmitted to adjacent discrete areas of the PCB by conduction through the lid. Second, because one lid is used to enclose the entire circuit board, the lid has to be tall enough to enclose the tallest electronic component on the PCB. As a result, this method of shielding does not allow designers to minimize space through the technique of nesting PCBs whereby electronic components are mounted on PCBs such that a tall component from one PCB will face a short component from a facing PCB. With no nesting, the spacing between facing PCBs will have to be at least as great as the height of the tallest component on the PCB plus the width of the shield plus some minimum clearance distance.

In another method, a metallic or conductive coated plastic implement, which comprises both the walls and lid of the shield, is used to shield discrete sections of a PCB. The shield is connected to the solder track of the PCB through the use of metal spring fingers or a conductive elastomer gasket attached to the shield's casting. This method suffers from several disadvantages. First, for this method to effectively shield EMI, both the PCB and the casting must be highly stiff and flat to ensure continuous contact between the casting, gasket and PCB. Second, this method requires extra board space because bolting or some other type of mechanical retention system is needed to fasten the casting to the circuit board with sufficient force to provide contact between the solder track on the PCB and the gasket on the casting. Third, this method makes rework of a PCB more difficult. The entire shield must be removed if rework of the PCB is needed.

In a third method, formed sheet metal boxes are soldered directly onto a track on the PCB. The shields are, therefore, permanently attached to the PCB. If the shield has to be removed for rework of the circuit board, the shield must be desoldered which often damages or destroys the PCB.

In a fourth method, sheet metal walls or fences are provided which can be surface mount soldered onto a circuit board. A formed sheet metal lid is snapped or pressed onto the walls to provide an RF seal. This method also suffers from several disadvantages. First, this method does not provide a high level of shielding between adjacent areas on the PCB because a single lid is used to enclose all of the shielded areas. Second, space between PCBs cannot be minimized because the lid will have to be tall enough to enclose the tallest electronic component on the PCB and effective nesting of components could not be achieved.

SUMMARY OF THE INVENTION

The present invention overcomes the problems noted above and satisfies the needs in this field for a shielding method that shields discrete areas of a PCB from other discrete areas through the use of separate shields.

It is therefore, the primary objective of the present invention to provide an apparatus and a method for E/M shielding a PCB that provides individual shields for discrete areas of the circuit board.

It is also an important object of the invention to provide such an apparatus and method that utilizes a frame or fence that does not take up much space on the solder track thereby utilizing minimal space.

It is an additional object of the invention to provide an apparatus and method that can be easily removed and reassembled to facilitate adjustment and rework of discrete areas.

It is also an important object of the invention to provide such an apparatus and method that can have shields that are adjusted to accommodate different component height restrictions between adjacent areas.

It is a further object of the invention to provide an apparatus and method that allows for the effective use of nesting techniques to cut down on the size requirement of the device.

It is also a further object of the invention to provide an apparatus and method that can be used on a flexible circuit board.

A preferred embodiment of an E/M shielding apparatus of this invention for shielding at least one discrete area of a printed circuit board having solder traces surrounding the discrete area includes a plurality of lids for shielding the discrete areas, each lid having a substantially planar top section and lid walls engaging the edges of the top section, the top section shaped to encapsulate the discrete area, the lid walls extending in a direction approximately perpendicular to the top section; and a frame adapted to be secured to the solder traces of the printed circuit board, the frame having fencing extending in a direction approximately perpendicular to the surface of the printed circuit board, the fencing positioned to enclose the discrete area, the fencing having interior surfaces that the discrete areas, the interior surfaces having means for attaching the walls of the lid to the interior surfaces whereby the lid attaches to the fencing to encapsulate the discrete area within the interior surfaces.

The shielding apparatus is preferably formed such that the means for attaching comprise a lip positioned on the upper section of the interior surface of the fence, the lip having a thickness greater than the thickness of the lower section of the interior surface of the fence. The shielding apparatus according to a preferred embodiment also has lid walls that elastically engage the edges of the top section of the lid thereby producing a spring force for pressing the lid walls into engagement with the lip on the interior surface of the fence. The shielding apparatus according to a preferred embodiment also includes lid walls having at least one dimple for locking the lid into position by engaging the underneath portion of the lip.

Additionally, the shielding apparatus is preferably formed such that the lid walls can be of different heights to accommodate discrete areas having components of different heights.

As will be appreciated, the invention is capable of other and different embodiments, and its several details are capable of modifications in various respect, all without departing from the spirit of the invention. Accordingly, the drawings and description of the preferred embodiment are to be regarded as illustrative in nature and not restrictive.

BRIEF DESCRIPTION OF THE DRAWINGS

The present invention satisfies the objects noted above as will become apparent from the following description when read in conjunction with the accompanying drawings wherein:

FIG. 2 is a perspective view of a shielding assembly of the present invention including the lids and frame attached to a printed circuit board.

DETAILED DESCRIPTION OF THE PREFERRED EMBODIMENT

Figure 1:
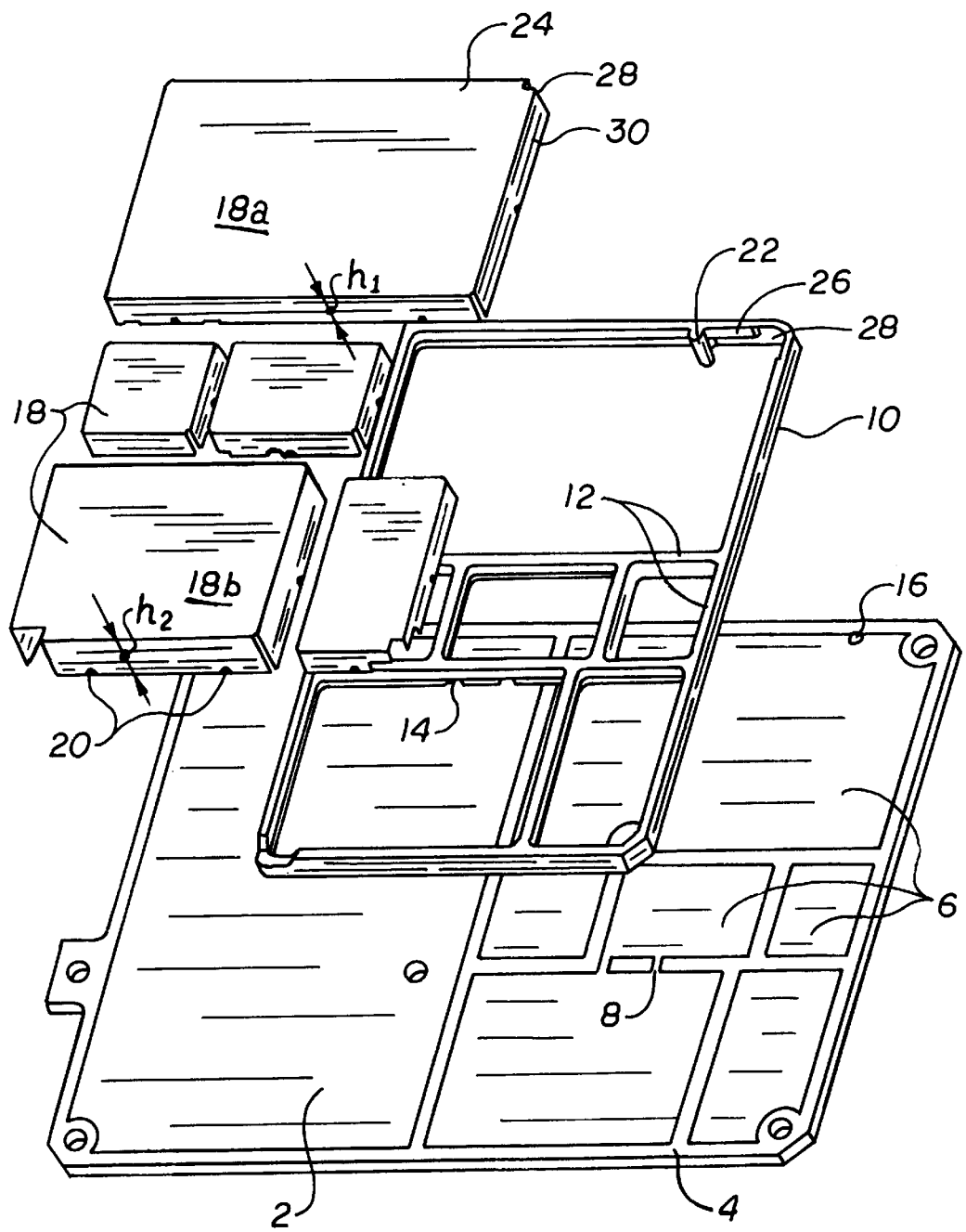
FIG. 1 is an exploded perspective view of a shielding assembly of the present invention including the lids and the frame overlying a printed circuit board.

Referring now to the drawings, FIGS. 1 and 2 set forth a printed circuit board 2. Electrical components (not shown) are mounted to discrete areas 6 of the circuit board 2 to form the electronic circuits residing on the circuit board 2. The circuit board 2 has solder tracks 4 which divide the circuit board 2 into discrete areas 6. The solder tracks 4 have discontinuities 8 that allow the connection of components and circuits from one discrete area 6 to the components and circuits of other discrete areas 6.

Metal frame 10 comprises a plurality of fences 12 that are arranged and connected together such that the fences 12 overlie the solder track 4. The fences contain grooves 14 that correspond to the discontinuities 8 in solder track 4. Thus, the frame 10 can be mounted to the solder track 4 without connecting the discontinuities 8 that allow the components from different discrete areas 6 to communicate with each other. Pins 22 in the cast frame match up with holes 16 in the circuit board 2 in order to accurately locate the frame 10 on the circuit board 2 prior to surface mount soldering. Thus, the frame 10 seals to the circuit board 2 with no gaps or crosstalk.

The frame 10 of the preferred embodiment is zinc die cast with a copper/nickel/tin plating to allow it to be surface mount soldered to the solder track 4 of the circuit board 2, although a person of ordinary skill would understand that other materials could be used such as aluminum or magnesium with an appropriate metal plating to prevent corrosion. Miniature die casting in zinc provides the tight tolerances required for this application, although, other methods of manufacture and materials could be used. Some sections of the fences 12 are also provided with lips 26 which are positioned on the top portion of the fences 12. The lips 26 are on the interior surfaces 28 of the fences 12, the sides of the fences 12 facing discrete areas 6 to be shielded. The solder track 4 needs to be just wide enough to accommodate the fences 12 and a fillet of solder around the fences 12.

Each discrete area 6 to be shielded has its own formed sheet metal lid 18. This allows the use of different height lids 18 such as lid 18a and lid 18b with heights h1 & h2, respectively, wherein height h2 is greater than height h1, to accommodate different component height restrictions between discrete areas 6. The lids 18 are used to encapsulate the discrete areas 6. The lids 18 comprise a substantially planar top section 24 and lid walls 30 engaging the edges 28 of the top section 24. The top section 24 is shaped to encapsulate the discrete area 6. The lid walls 30 extend in a direction approximately perpendicular to the top section 24. The lids 18 snap into the separate compartments of the frame by means of the spring force of the lid walls pressing against the frame lip 26. Dimples 20 on the lid walls 30 lock the lids 18 in place. These dimples 20 fit under a lip 26 on the interior surface 28 of the fences 12. The lids 18 are thin (about 0.008") so the additional height required above the components is minimal. The lids 18 can be made of formed sheet metal of different compositions. In the preferred embodiment the lids 18 are made of steel with tin plating over the top. However, many other combinations of elements can be used such as copper with tin plating, beryllium/copper alloy, phosphorous bronze, brass or a conductive plastic with a metal coating such as tin plating.

Having described in detail the preferred embodiment of the present invention, it is to be understood that this invention could be carried out with different elements. This preferred embodiment is presented only by way of example and is not meant to limit the scope of the present invention which is defined by the following claims.

What is claimed is:

1. An electromagnetic shielding apparatus for a circuit board having solder traces comprising:

a) a lid for shielding a discrete area of the circuit board; and b) a one piece frame unit configured for securement to the solder traces of the circuit board, said frame having continuously connecting fencing extending in an outward direction from the surface of the printed circuit board, said fencing being arranged to surround the discrete area, said fencing having separate interior surfaces each of which surrounds and defines the periphery of the discrete area, said interior surface being configured to retain said lid in the installed position to said fencing to encapsulate the discrete area.

2. The shielding apparatus according to claim 1 wherein the lid is retained by the interior surface in the installed position by an interlock mechanism.

3. The shielding apparatus according to claim 2 wherein the interlock mechanism comprises a lip on the upper section of the interior surface and at least one dimple on the lid walls for locking the lid into position by latching underneath said lip.

4. The shielding apparatus according to claim 1 wherein the lid includes a top section and lid walls that engage the edges of the top section, the apparatus also having at least a first and a second lid wherein the height of said lid walls of said first lid is different from the height of said lid walls to said second lid.

5. The shielding apparatus according to claim 1 wherein said fencing includes a section of fencing having opposite surfaces that are each interior surface for separate discrete areas.

6. The apparatus according to claim 1 further comprising a second lid for shielding a second discrete area and wherein said frame is also arranged to surround said second discrete area and said fencing has separate interior surfaces each of which surrounds and defines the periphery of the second discrete area.

* * * * *